United States Patent [19]

Lin

[11] Patent Number: 5,663,108

[45] Date of Patent: Sep. 2, 1997

[54] OPTIMIZED METAL PILLAR VIA PROCESS

[75] Inventor: Yung-Fa Lin, Hsin-chu, Taiwan

[73] Assignee: Taiwan Semiconductor Manufacturing Company, Ltd., Hsin-chu, Taiwan

[21] Appl. No.: 663,572

[22] Filed: Jun. 13, 1996

[51] Int. Cl.$^6$ .................................................. H01L 21/469
[52] U.S. Cl. ........................... 438/624; 438/626; 438/633
[58] Field of Search .............................. 437/44, 192, 194, 437/195, 197, 228, 231, 978

[56] References Cited

U.S. PATENT DOCUMENTS

| | | | |
|---|---|---|---|
| 4,917,759 | 4/1990 | Fisher et al. | 437/192 |
| 5,262,354 | 11/1993 | Cote et al. | 437/194 |
| 5,312,512 | 5/1994 | Allman et al. | 437/231 |
| 5,354,712 | 10/1994 | Ho et al. | 437/192 |
| 5,366,911 | 11/1994 | Lur et al. | 437/192 |
| 5,514,616 | 5/1996 | Rostoker et al. | 437/231 |
| 5,516,729 | 5/1996 | Dawson et al. | 437/231 |

*Primary Examiner*—Chandra Chaudhari
*Attorney, Agent, or Firm*—George O. Saile

[57] ABSTRACT

A new approach for creating metal pillar via structures, for multilevel metallization structures, used in the fabrication of MOSFET devices, has been developed. Consecutive metal depositions are performed, followed by a RIE procedure, used to create the desired first level metallization shape in the metallizations. Another RIE procedure than selectively forms the metal pillar via structure on the underlying first level metallization structure. Composite dielectric material, including a spin on glass layer, is used to fill the spaces between metal structures. Chemical mechanical polishing is used to create the desired planarity, followed by the construction of a second level metallization structure, contacting the underlying first level metallization structure by use of the metal pillar via structure.

25 Claims, 5 Drawing Sheets

5,663,108

1

OPTIMIZED METAL PILLAR VIA PROCESS

BACKGROUND OF THE INVENTION

(1) Field of the Invention

This invention relates to processes used to manufacture semiconductor devices, and more specifically to processes used to create metal vias, used to interconnect metallization levels.

(2) Description of Prior Art

The semiconductor industry is continually attempting to provide the customer with higher performing silicon devices, while still maintaining, or even decreasing the cost of silicon chips. These objectives have been met by the semiconductor industry achieving micro-miniaturazation, or the ability to successfully create sub-micron device features. Significant advances in specific semiconductor fabrication disciplines, such as photolithography and dry etching, have allowed micro-miniaturazation to become reality. For example more sophisticated exposure cameras, as well as the development of more sensitive photoresist materials, have allowed sub-micron images in photoresist layers to be created. Similar advances in anisotropic, reactive ion etching, (RIE), has resulted in the sub-micron images in the overlying photoresist layer, being successfully defined in underlying materials, used for the fabrication of semiconductor devices.

However as specific features are reduced in size, several new concerns, not encountered with devices fabricated using less aggressive groundrules, are created. For example via holes in an interlevel dielectric material, used to interconnect metallization levels, when filled with a via metal, are difficult to properly fill due to the decreasing diameter of the via hole. The conformality of the depositing via metal decreases as the dimensions of the via hole shrink. Lack of metal in the via hole can result in significant reliability problems in terms of electromigration. In addition the narrower spaces between metal lines present problems when using standard insulator processes to fill these sub-micron spaces. The problems encountered with sub-micron features, namely the difficulty in filling narrow via holes with metal, as well as filling narrow spaces, between metal structures with insulator, have been addressed. For example Allman, et al, in U.S. Pat. No. 5,312,512, Fisher, et al, in U.S. Pat. No. 4,917,759, and Cote, et al, in U.S. Pat. No. 5,262,354, have described methods for creating narrow metal vias, as well as methods for insulator filling of narrow spaces between metal structures. However this invention will describe a fabrication process that offers a more complete solution to the sub-micron metal and insulator fill situation.

SUMMARY OF THE INVENTION

It is an object of this invention to consecutively deposit metallization layers for both an underlying interconnect structure, and an overlying metal pillar via structure.

It is another object of this invention to create a narrow, metal pillar via structure on an underlying metallization interconnect structure.

It is still another object of this invention to fill the narrow spaces between metal pillar structures with a composite dielectric material, with one of the layers being a spin in glass material.

It is still yet another object of this invention to remove the composite dielectric material, from the top surface of the metal pillar structure, via a chemical mechanical polishing process.

2

In accordance with the present invention a method is described for forming via interconnects, using metal pillar via structures, and using spin on glass and chemical mechanical polishing for passivation and planarization purposes. A dual deposition, consisting of a first metallization layer, to be used for the first level interconnect structure, followed by a second metallization layer, to be used for the metal pillar via structure, is performed on an underlying semiconductor substrate. Patterning is performed to create the desired first level interconnect structure in the dual metallization layers. A dielectric layer is deposited and subjected to a anisotropic, dry etching procedure, to create an insulator sidewall spacer on the sides of the etched dual metallization structure. Another patterning procedure is than performed on the second metallization layer, via selective, anisotropic dry etching processing, to create a metal pillar via structure. A composite dielectric material is next deposited, using a spin on glass as one of the components of the composite dielectric material, for purposes of filling the narrow spaces between metal pillar via structures. After a bakeout and curing procedure, applied to remove volatile components from the spin on glass layer, a chemical mechanical polishing procedure is used for planarization purposes, and to expose the top surface of the metal pillar via structure. A third metallization layer is than deposited and patterned to create the second level interconnect structure, connected to the first level interconnect structure by the metal pillar via structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of forming metal pillar via structures, and the passivation and planarization process used, will now be covered in detail. This invention can be applied to metallization interconnects used for fabricating MOSFET devices now being manufactured un industry, therefore only the specific areas, unique to understanding this invention will be covered in detail.

Figure 1:
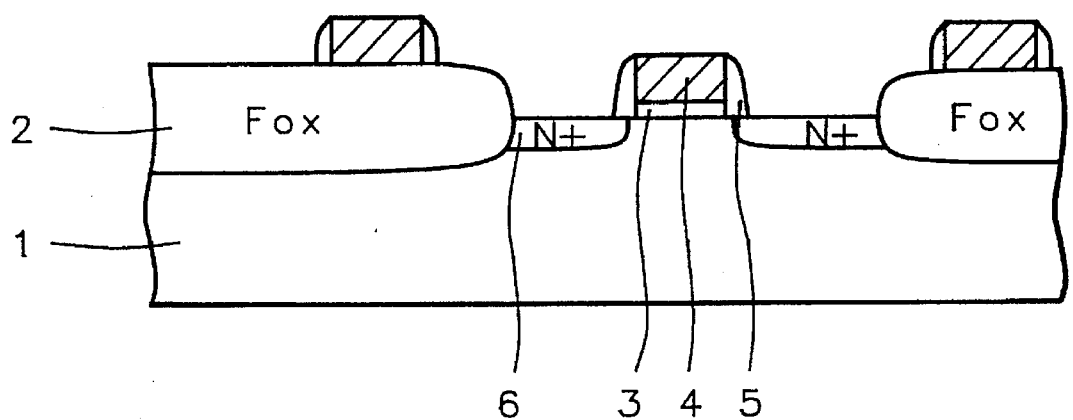
FIG. 1, which schematically, in cross-sectional style, shows a standard metal oxide semiconductor field effect transistor, (MOSFET), device, prior to metallization processing.

An N channel, MOSFET device, in which the optimized metal pillar via process will be applied to, is shown in FIG. 1. A P type, single crystalline silicon substrate, 1, with a <100> crystallographic orientation, is used. Thick field oxide regions, (FOX), 2, are created for purposes of device isolation. Briefly the process used to create the FOX regions is to initially form an oxidation mask, consisting of an overlying, chemically vapor deposited, silicon nitride layer, used as the oxidation mask, and an underlying thermally grown, silicon dioxide layer, used to buffer the stress of the overlying silicon nitride layer, during the subsequent FOX process. The composite mask is patterned using conventional photolithographic and reactive ion etching, (RIE) processing. After photoresist removal, using plasma oxygen ashing, the POX regions are created by oxidation in an oxygen—steam ambient, at a temperature between about 900° to 1050° C., to a thickness between about 4000 to 6000 Angstroms. After removal of the masking layers, using hot phosphoric acid for silicon nitride and a buffered hydrofluoric acid solution for the underlying silicon dioxide layer, a silicon dioxide, gate insulator, 3, is thermally grown at a temperature between about 800° to 1000° C., in an oxygen-steam ambient, to a thickness between about 50 to 300 Angstroms. Next a layer of polysilicon is deposited using low pressure chemical vapor deposition, (LPCVD), processing, at a temperature between about 600° to 800° C., to a thickness between about 2000 to 4000 Angstroms. The polysilicon layer is next subjected to an ion implantation of phosphorous, at an energy between about 50 to 100 Kev, at a dose between about 5E14 to 1E16 atoms/cm$^2$. Standard photolithographic and RIE processes, using a $Cl_2$ based gas as an etchant, are used to create polysilicon gate structure, 4, shown schematically in FIG. 1. After photoresist removal, via use of plasma oxygen ashing, followed by wet cleans, a silicon oxide layer is deposited, using either LPCVD or plasma enhanced chemical vapor deposition, (PECVD), processing. The silicon oxide layer is grown at a temperature between about 500° to 800° C., to a thickness between about 1000 to 4000 Angstroms, using tetraethylorthosilicate as a source. A selective, anisotropic, RIE procedure, using $CHF_3$ as an etchant, is used to create insulator sidewall spacer, 5. An ion implantation of arsenic, at an energy between about 50 to 100 Kev., at a dose between about 5E13 to 5E14 atoms/cm$^2$, is used to form source and drain regions, 6, shown in FIG. 1.

Figure 2:
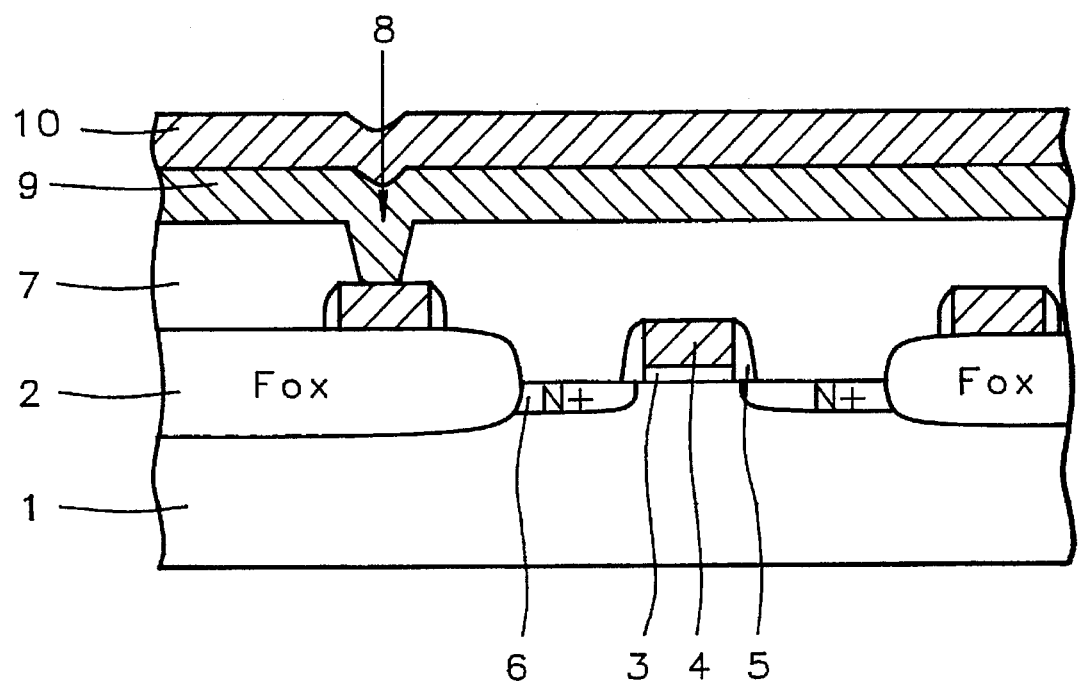
FIGS. 2–3, which in cross-sectional form, show the formation of the first level interconnect structure.

FIG. 2, shows the deposition of a silicon oxide layer, 7, obtained using either LPCVD or PECVD processing, grown at a temperature between about 500° to 80020 C., to a thickness between about 5000 to 7000 Angstroms. A contact hole, 8, is created in silicon oxide layer, 7, to expose the top surface of polysilicon gate structure, 4. This is accomplished using conventional photolithographic and RIE procedures, using $CHF_3$ as an etchant. Photoresist removal is again accomplished using plasma oxygen ashing, followed by careful wet cleans. Consecutive metal depositions are next performed for purposes of subsequent creation of an underlying first level interconnect structure, and a metal pillar via structure. The first metal layer, 9, to subsequently be used for forming a first level interconnect structure, is aluminum, containing between about 1 to 3% copper, and between about 1 to 2% silicon, deposited using r.f. sputtering, to a thickness between about 5000 to 10000 Angstroms. The second metal layer, 10, to subsequently be used for construction of a metal pillar via structure, is tungsten, deposited again using r.f. sputtering, or LPCVD processes. The thickness of tungsten layer, 10, is between about 5000 to 6000 Angstroms.

Figure 3:
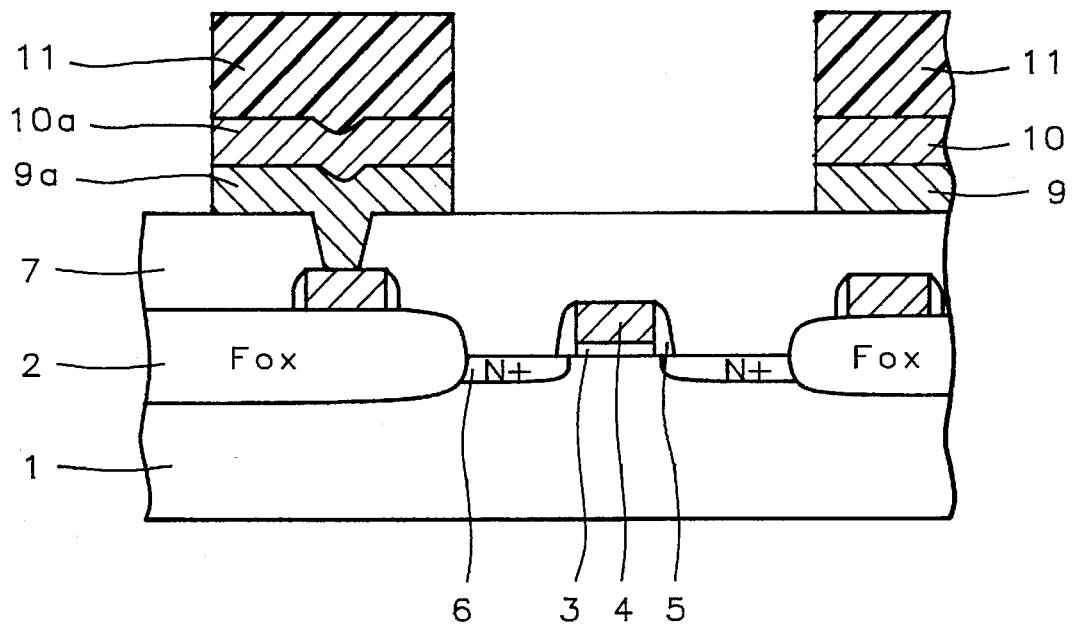
Figure 4:
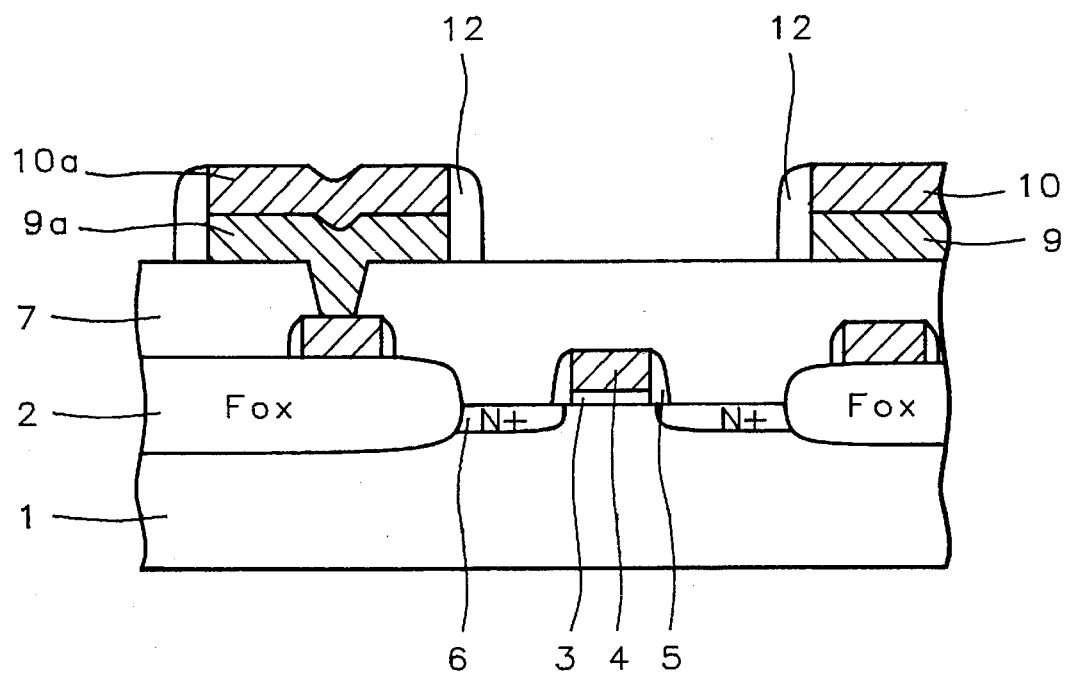
FIG. 4, which in cross-sectional style, indicates the formation of the insulator sidewall spacer on the exposed sides of the metallization structure.

A photolithographic procedure is employed to form photoresist shape, 11, shown schematically in FIG. 3. A RIE procedure, using $NF_3$ is used to etch tungsten layer, 10, producing tungsten shape 10a, while $Cl_2$ is used to etch the underlying aluminum based layer, 9. The shape created in the dual metal layers is the shape desired for the first level interconnect structure, 9a. Photoresist removal is next performed using plasma oxygen ashing, followed by careful wet cleans. A PECVD, silicon oxide layer, is next deposited at a temperature between about 400° to 600° C., to a thickness between about 1000 to 2000 Angstroms. An insulator sidewall spacer, 12, is than created on the exposed sides of the metal structure, 9a, and metal structure, 10a, via anisotropic RIE procedures using $CHF_3$ as an etchant. This is shown schematically in FIG. 4.

Figure 5A:
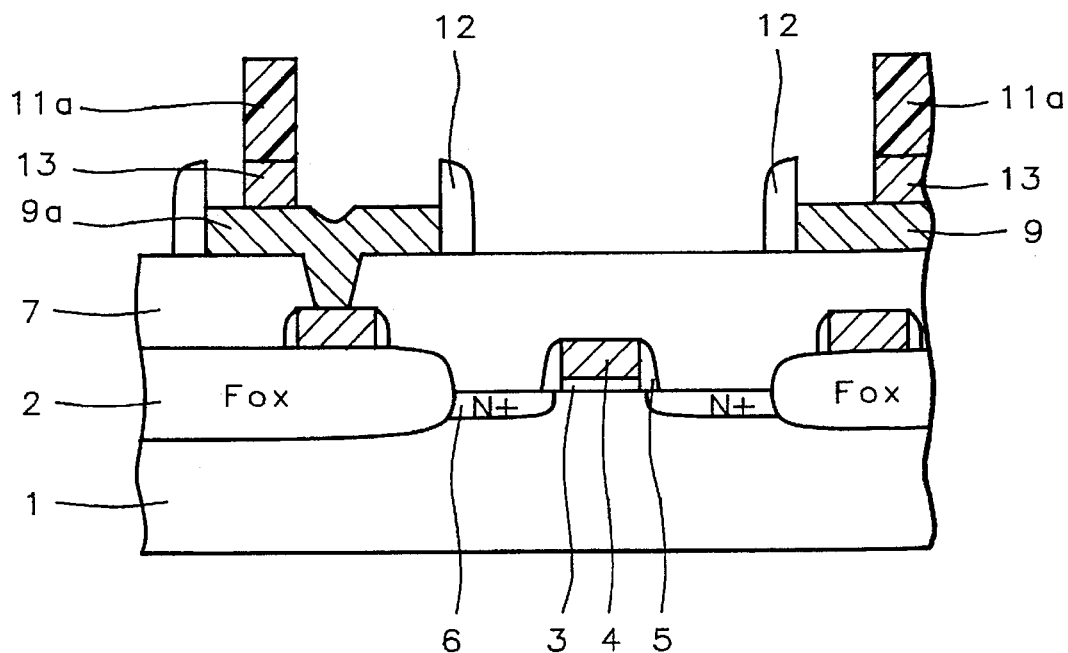
FIGS. 5a–5b, which in cross-sectional form, show two views of a metal pillar via structure on an underlying first level interconnect structure.
Figure 5B:
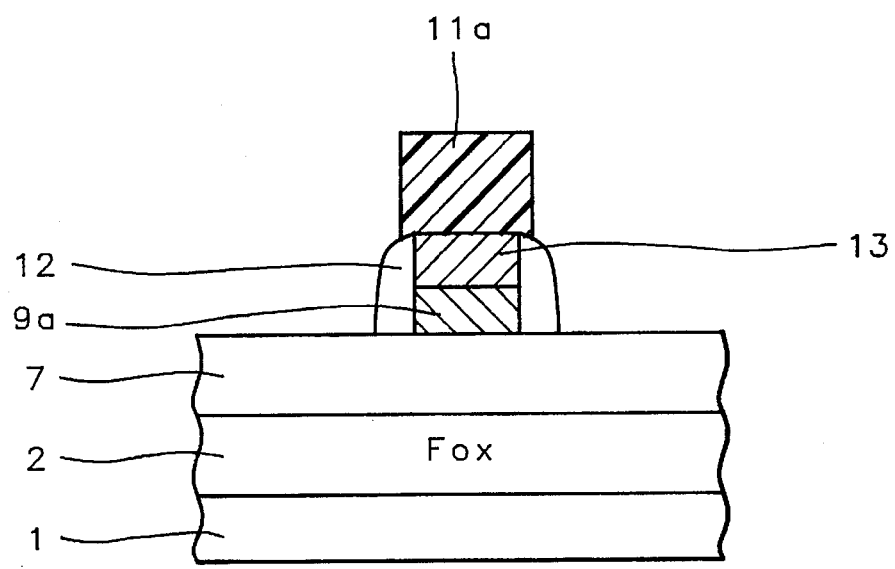

A critical photolithographic and RIE procedure is next used to create metal pillar via structure, 13, shown schematically, in cross-sectional style in FIG. 5a, and shown schematically, in cross-sectional style, in FIG. 5b, but offset 90 degrees, when compared to FIG. 5a. Photoresist shape, 11a, is used to define the needed metal pillar via structure. The RIE etchant used to define metal pillar via structure, 13, is $NF_3$, which will provide the needed selectivity between tungsten, and the underlying first level interconnect, aluminum based structure, 9a. Without having a selectivity of between about 3 to 1, tungsten to aluminum etch rate, the underlying first level interconnect structure would be severely thinned at the conclusion of the metal pillar via structure sequence, which includes a tungsten overetch sequence to insure complete tungsten removal. FIG. 5a shows the tungsten metal pillar via structure, 13, post photoresist removal, which was accomplished using plasma oxygen ashing, followed by wet chemical cleans. The importance of insulator sidewall spacer, 12, can be seen in FIG. 5b, where the metal pillar via structure is defined on the narrow section, or the width of first level interconnect structure, 9a. Without the ability to place photoresist shape, 11a, slightly overlapping insulator sidewall spacer, 12, gouging from the subsequent RIE procedure, may occur, producing a topography that would present coverage problems for subsequent metallizations.

Figure 6:
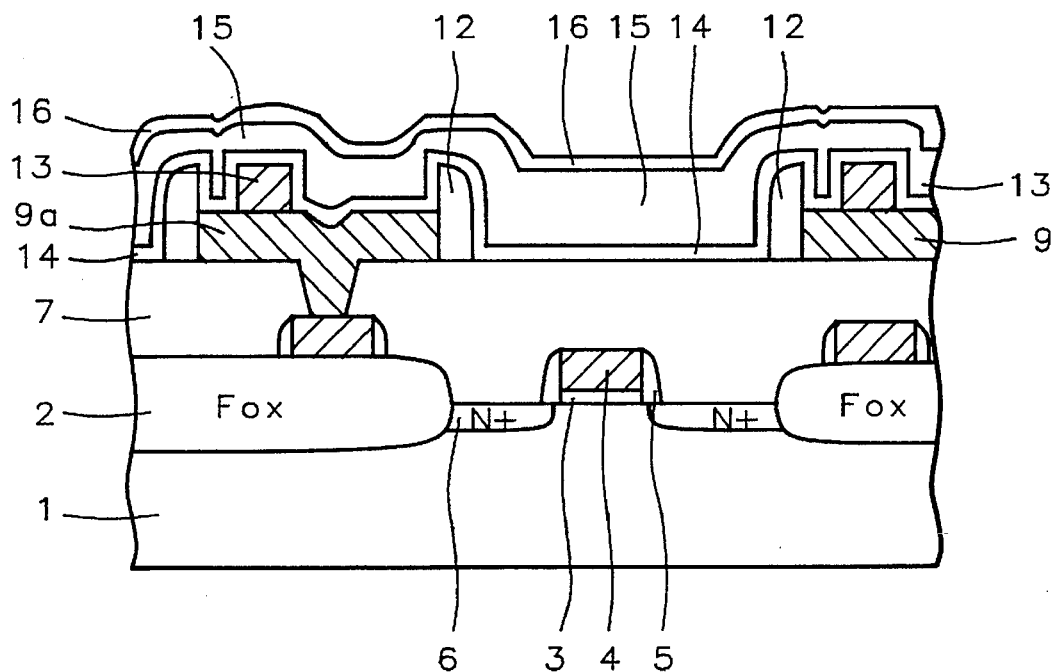
FIGS. 6–7, which in cross-sectional style, show the passivation and planarization stages of this process.
Figure 7:
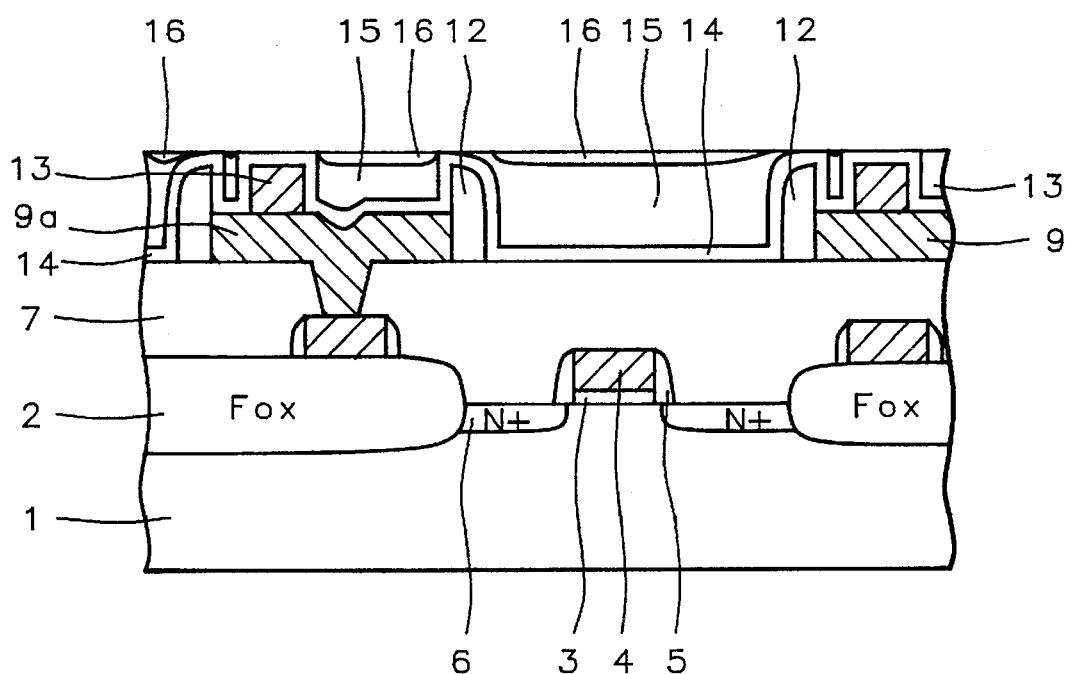

The passivation and filling of the narrow spaces between metal pillar via structures, 13, is next addressed. A first plasma, silicon oxide layer, 14, is deposited using PECVD processing, at a temperature between about 400° to 600° C., to a thickness between about 1000 to 2000 Angstroms. This layer offers the necessary passivation for first level interconnect structure, 9a, as well as for metal pillar via structure, 13. Next a spin on glass, (SOG), 15, is applied using siloxane, to a thickness between about 6000 to 8000 Angstroms. The properties of the SOG material allow the narrow spaces between metal pillar via structures to be adequately filled. A bakeout procedure at a temperature between about 200° to 300° C., and a curing procedure, at a temperature between about 300° to 400° C., are employed to remove volatile components from SOG layer, 15, that if left unremoved may outgas during subsequent processing steps, perhaps attacking adjacent metallization structures. Finally a second plasma oxide layer, 16, is deposited using PECVD processing, at a temperature between about 400° to 600° C., to a thickness between about 6000 to 8000 Angstroms. The results of these passivation procedures are shown schematically in FIG. 6. Chemical mechanical polishing, (CMP), is performed to produce the desired planarity, and performed to a level in which the top surface of metal pillar via structure, 13, is exposed. This is shown schematically in FIG. 7.

Figure 8A:
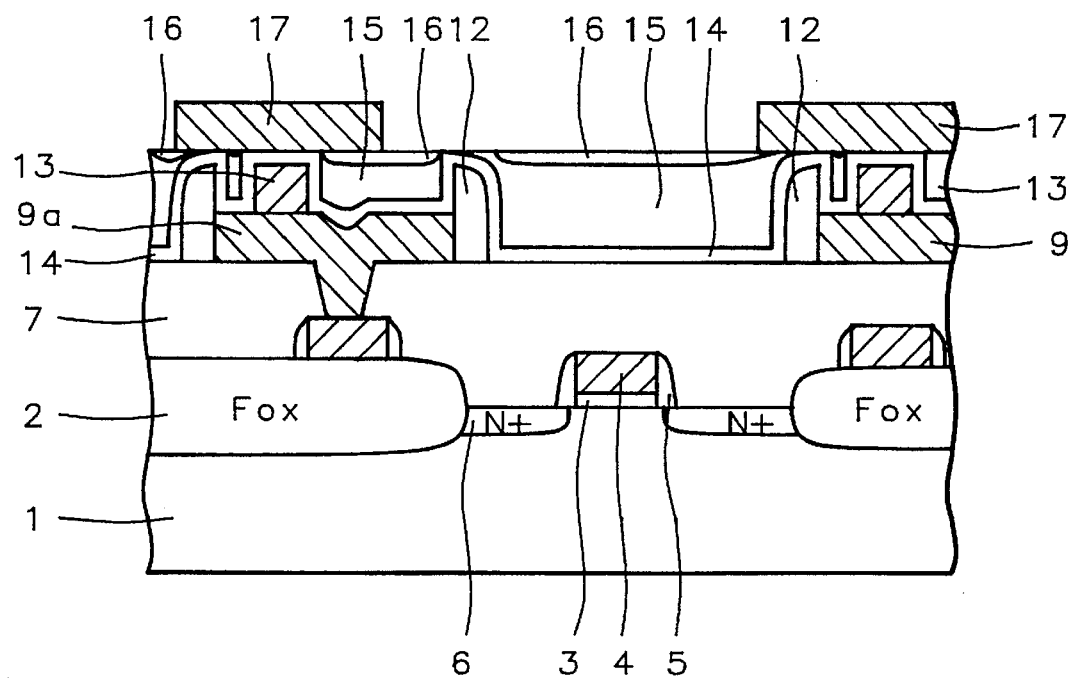
FIGS. 8a–8b, which schematically, in cross-sectional style, show two views of a second level interconnect structure, connected to an underlying first level interconnect structure, by use of a metal pillar via structure.
Figure 8B:
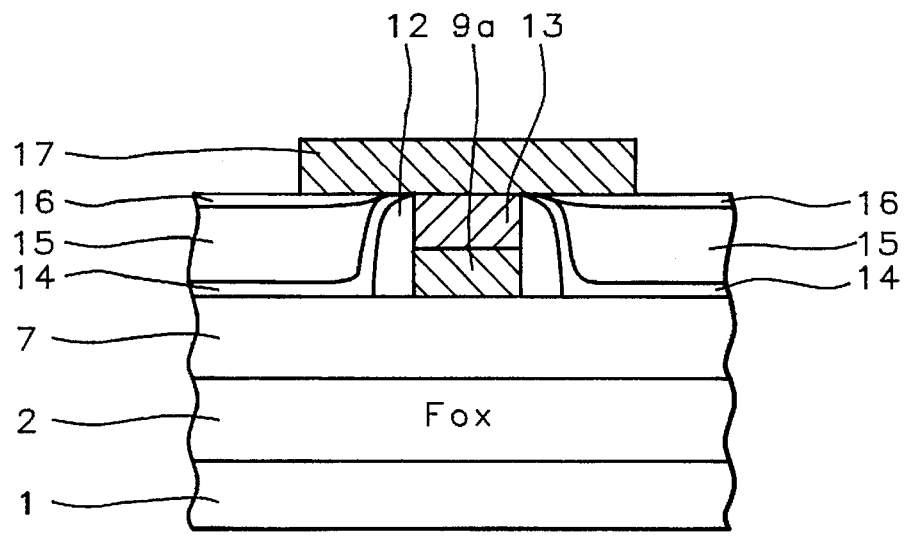

FIGS. 8a–8b, indicate the fabrication of a second level interconnect structure, 17, electrically connected to underlying first level interconnect structure, 9a, by use of a metal pillar via structure, 13. The second level interconnect structure is fabricated by the r.f. sputter deposition of aluminum, containing between about 1 to 3% copper, at a thickness between about 5000 to 10000 Angstroms. Conventional photolithographic and RIE procedures, using a $Cl_2$ based etchant, are used to create second level metallization structure, 17, shown schematically in FIG. 8a, an again shown in FIG. 8a, using a cross-sectional schematic, 90 degrees offset from the section shown in FIG. 8a. Again photoresist removal was performed using plasma oxygen ashing, followed by careful wet cleans.

This process for an optimized metal via structure, although shown as part of a N channel device, can also be applied to P channel devices, CMOS, (N and P channel devices), BiCMOS, (bipolar and CMOS devices), as well to bipolar devices.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a MOSFET device, on a semiconductor substrate, using a metal pillar via structure for electrical contact between multilevel interconnect metallizations, comprising the steps of:

providing an element of said MOSFET device;

deposition of a first insulator layer on said semiconductor substrate, including deposition on said element of said MOSFET device;

opening a contact hole in said first insulator layer, to said element of said MOSFET device;

deposition of a first metallization layer on said first insulator layer, and on exposed top surface of said element, of said MOSFET device, in said contact hole;

deposition of a second metallization layer on said first metallization layer;

patterning of said second metallization layer and underlying, said first metallization layer, to create a composite, metal interconnect structure, providing contact to underlying, said element of said MOSFET device;

deposition of a second insulator layer on said composite, metal interconnect structure, and on said first insulator layer, not covered by said composite, metal interconnect structure;

anisotropic etching of said second insulator layer, to create an insulator sidewall spacer, on sides of said composite, metal interconnect structure;

patterning of said second metallization layer, of said composite, metal interconnect structure, to create a metal pillar via structure, while leaving said first metallization layer, of said composite, metal interconnect structure, unetched, creating an underlying first level interconnect structure;

deposition of a first plasma insulator layer on said metal pillar via structures, on said first level interconnect structure, on said insulator sidewall spacers, and on said first insulator layer, not covered by said first level interconnect structure, or said insulator sidewall spacer;

application of a spin on glass layer on said first plasma insulator layer, filling spaces between said metal pillar via structures, and filling spaces between said first level interconnect structures;

baking of said spin on glass layer;

curing of said spin on glass layer;

deposition of a second plasma insulator layer, on said spin on glass layer;

chemical mechanical polishing to expose top surface of said metal pillar via structure by removal of said second plasma insulator layer, of said spin on glass layer, and of said first plasma insulator layer, from top surface of said metal pillar via structure;

deposition of a third metallization layer on exposed top surface of said metal pillar via structure, and on surfaces of said second plasma insulator layer, of said spin on glass layer, and of said first plasma insulator layer, in spaces between said metal pillar via structures, and in spaces between said first level interconnect structures; and patterning of said third metallization layer to create second level interconnect structure, contacting underlying metal pillar via structure.

2. The method of claim 1, wherein said element, of said MOSFET device, is a polysilicon gate structure.

3. The method of claim 1, wherein said first metallization layer is aluminum, containing between about 1 to 3% copper, and containing between about 1 to 2% silicon, deposited using r.f. sputtering, to a thickness between about 5000 to 6000 Angstroms.

4. The method of claim 1, wherein said second metallization layer is tungsten, deposited using r.f. sputtering to a thickness between about 5000 to 6000 Angstroms.

5. The method of claim 1, wherein said second metallization layer is tungsten, deposited using LPCVD processing, at a temperature between about 200° to 600° C., to a thickness between about 5000 to 6000 Angstroms, using tungsten hexafluoride as a source.

6. The method of claim 1, wherein said second insulator layer, used to create said insulator sidewall spacer, is silicon oxide, deposited using PECVD processing, at a temperature between about 400° to 600° C., to a thickness between about 1000 to 2000 Angstroms.

7. The method of claim 1, wherein said metal pillar via structure is formed by RIE processing of said second metallization layer, using $NF_3$ as an etchant.

8. The method of claim 1, wherein said first plasma insulator layer is silicon oxide, deposited using PECVD processing, at a temperature between about 400° to 600° C., to a thickness between about 1000 to 2000 Angstroms.

9. The method of claim 1, wherein said spin on glass layer is applied to a thickness between about 6000 to 8000 Angstroms, using siloxane as a source.

10. The method of claim 1, wherein said spin on glass layer is baked at a temperature between about 200° to 300° C., and cured at a temperature between about 300° to 400° C.

11. The method of claim 1, wherein said second plasma insulator layer is deposited using PECVD processing, at a temperature between about 400° to 600° C., to a thickness between about 600 to 8000 Angstroms.

12. The method of claim 1, wherein said chemical mechanical polishing is performed to a level in which the top surface of said metal pillar via structure is exposed.

13. The method of claim 1, wherein said third metallization layer is aluminum, containing between about 1 to 3% copper, deposited using r.f. sputtering, to a thickness between about 5000 to 10000 Angstroms.

14. A method of fabricating a MOSFET device, on a semiconductor substrate, using a tungsten pillar via structure to electrically connect underlying and overlying aluminum based, interconnect metallizations, comprising the steps of:

providing a polysilicon gate structure, of said MOSFET device;

deposition of a first insulator layer on said semiconductor substrate, including on said polysilicon gate structure, of said MOSFET device;

opening a contact hole in said first insulator layer, to expose top surface of said polysilicon gate structure;

deposition of a first aluminum based metallization layer, on said first insulator layer, and on exposed top surface of said polysilicon gate structure, in said contact hole;

deposition of a tungsten layer on underlying, said first aluminum based metallization layer;

patterning of said tungsten layer, and of underlying, said first aluminum based metallization layer, to create a composite, metal interconnect structure;

deposition of a second insulator layer on said composite, metal interconnect structure, and on said first insulator layer, not covered by said composite, metal interconnect structure;

anisotropic etching of said second insulator layer, to create an insulator sidewall spacer, on sides of said composite, metal interconnect structure;

patterning of said tungsten layer, of said composite, metal interconnect structure, to create said tungsten pillar via structure, while leaving underlying first aluminum based metallization layer, of said composite, metal interconnect structure, unetched, creating a first level, aluminum based, interconnect structure;

deposition of a first plasma insulator on said tungsten pillar via structure, on said first level, aluminum based, interconnect structure, on said insulator sidewall spacers, and on said first insulator layer, not covered by said first level, aluminum based, interconnect structure or said insulator sidewall spacer;

application of a spin on glass layer on said first plasma insulator layer, filling spaces between said tungsten pillar via structures, and filling spaces between said first level, aluminum based, interconnect structure;

baking of said spin on glass layer;

curing of said spin on glass layer;

deposition of a second plasma insulator layer on said spin in glass layer;

chemical mechanical polishing to expose top surface of said tungsten pillar via structure, by removal of said second plasma insulator layer, of said spin on glass layer, and of said first plasma insulator layer, from top surface of said tungsten pillar via structure;

deposition of a second aluminum based metallization layer on exposed top surface of said tungsten pillar via structure, and on top surfaces of said second plasma insulator layer, of said spin on glass layer, and of said first plasma insulator layer, in spaces between said tungsten pillar via structures, and in spaces between said first level, aluminum based, interconnect structures; and patterning of said second aluminum based metallization layer to create a second level, aluminum based, interconnect structure, contacting underlying tungsten pillar via structure.

15. The method of claim 14, wherein said first aluminum based metallization layer is aluminum, containing between 1 to 3% copper, and between 1 to 2% silicon, deposited using r.f. sputtering, to a thickness between about 5000 to 10000 Angstroms.

16. The method of claim 14, wherein said tungsten layer is deposited using r.f. sputtering, to a thickness between about 5000 to 6000 Angstroms.

17. The method of claim 14, wherein said tungsten layer is deposited using LPCVD processing, at a temperature between about 200° to 600° C., to a thickness between about 5000 to 6000 Angstroms, using tungsten hexafluoride as a source.

18. The method of claim 14, wherein said second insulator, used to create said insulator sidewall spacer, is silicon oxide, deposited using PECVD processing, at a temperature between about 400° to 600° C., to a thickness between about 1000 to 2000 Angstroms.

19. The method of claim 14, wherein said tungsten pillar via structure is formed by RIE processing, using $NF_3$ as an etchant.

20. The method of claim 14, wherein said first plasma insulator layer is silicon oxide, deposited using PECVD processing, at a temperature between about 400° to 600° C., to a thickness between about 1000 to 2000 Angstroms.

21. The method of claim 14, wherein said spin on glass layer is applied to a thickness between about 6000 to 8000 Angstroms, using siloxane as a source.

22. The method of claim 14, wherein said spin on glass layer is baked at a temperature between about 200° to 300° C., and cured at a temperature between about 300° to 400° C.

23. The method of claim 14, wherein said second plasma insulator layer is silicon oxide, deposited using PECVD processing, at a temperature between about 400° to 600° C., to a thickness between about 6000 to 8000 Angstroms.

24. The method of claim 14, wherein said chemical mechanical polishing is performed to a level in which the top surface of said metal pillar via structure is exposed.

25. The method of claim 14, wherein said second aluminum based metallization layer is aluminum, containing between 1 to 3% copper, deposited using r.f. sputtering, to a thickness between about 5000 to 10000 Angstroms.

* * * * *